(12) United States Patent
Shimoike

(10) Patent No.: US 7,559,140 B2
(45) Date of Patent: Jul. 14, 2009

(54) METHOD FOR MOUNTING MULTISHAFT SERVO AMPLIFIER MODULE

(75) Inventor: Shoichiro Shimoike, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 428 days.

(21) Appl. No.: 10/532,046

(22) PCT Filed: Oct. 14, 2003

(86) PCT No.: PCT/JP03/13143

§ 371 (c)(1),
(2), (4) Date: Apr. 21, 2005

(87) PCT Pub. No.: WO2004/036971

PCT Pub. Date: Apr. 29, 2004

(65) Prior Publication Data

US 2006/0038526 A1 Feb. 23, 2006

(30) Foreign Application Priority Data

Oct. 21, 2002 (JP) ............................ 2002-305941

(51) Int. Cl.
*H01R 43/00* (2006.01)
*H05K 13/00* (2006.01)
(52) U.S. Cl. ............................ 29/854; 29/855; 29/896; 174/16.3; 318/591; 318/675; 318/677; 361/695; 361/704

(58) Field of Classification Search ............... 29/854, 29/596, 855, 896, 965; 174/16.3; 318/591, 318/675, 677; 361/695, 704
See application file for complete search history.

(56) References Cited

U.S. PATENT DOCUMENTS 6,226,181 B1 * 5/2001 Hashimoto et al. .......... 361/695
6,514,065 B2 * 2/2003 Usui et al. .................. 425/162

FOREIGN PATENT DOCUMENTS

| JP | 50-40582 A | 12/1975 |
| JP | 59-69999 A | 4/1984 |
| JP | 8-139473 A | 5/1996 |
| JP | 11-289181 A | 10/1999 |
| JP | 2001-230567 | * 8/2001 |
| JP | 2001-230567 A | 8/2001 |
| JP | 2002-140103 A | 5/2002 |

* cited by examiner

*Primary Examiner*—Thiem Phan
(74) *Attorney, Agent, or Firm*—Sughrue Mion, PLLC

(57) ABSTRACT

In a method for mounting a plurality of multishaft servo-amplifier modules, each of which has an identical shape and an identical function to each other and carries semiconductor power elements, on a multishaft servo-amplifier for driving motors, a plurality of multishaft servo-amplifier modules (1) through (6) are mounted on both the surfaces of a multishaft interface substrate (7) as a base plate in parallel with the surfaces of the substrate (7) to constitute a multishaft servo-amplifier function unit for a host controller.

3 Claims, 10 Drawing Sheets

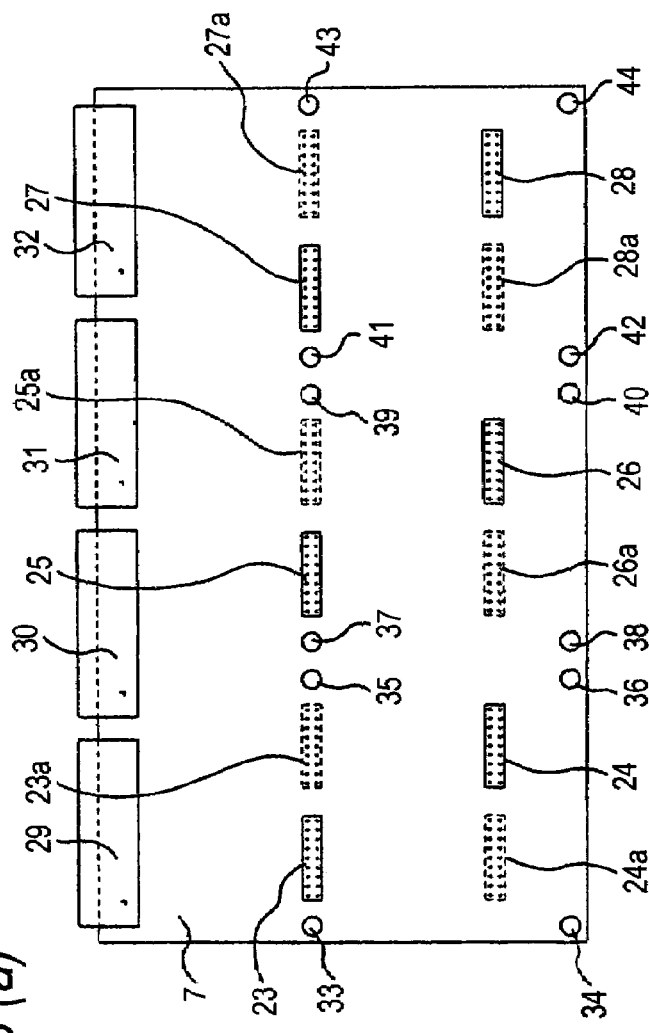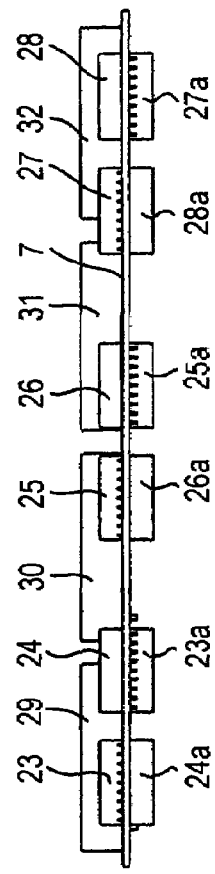
FIG. 3(a)
FIG. 3(b)

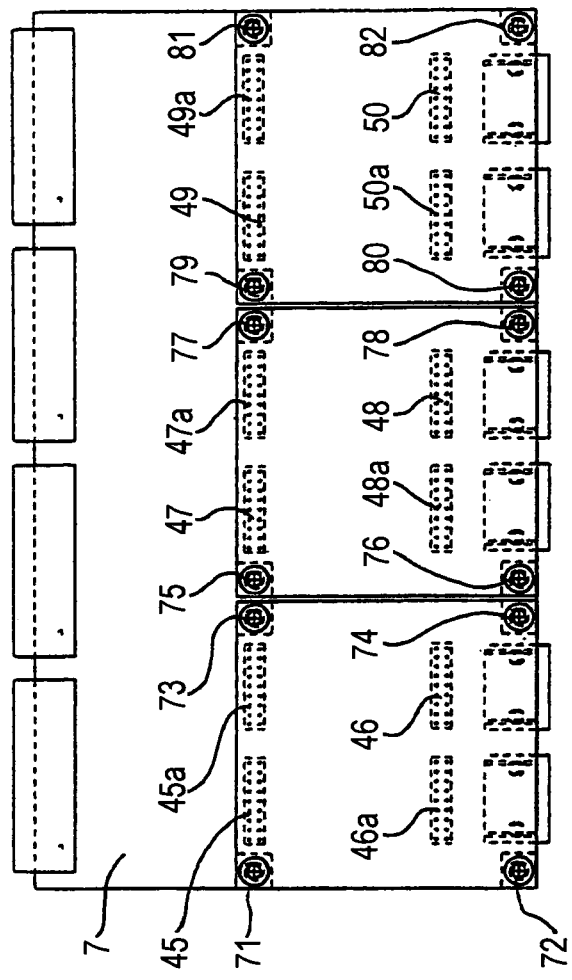
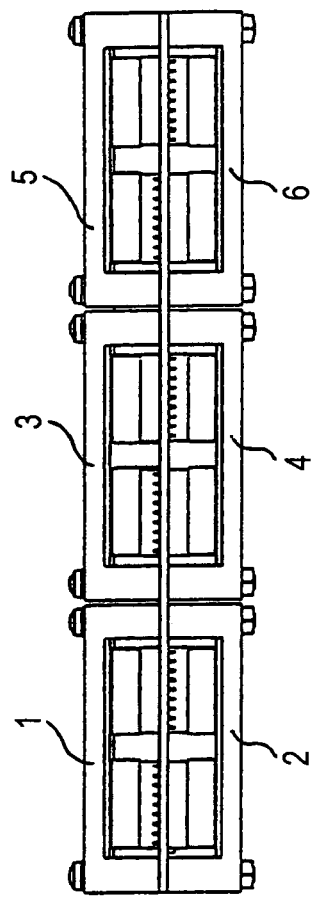
FIG. 5(a)
FIG. 5(b)

FIG. 9 (a)     PRIOR ART
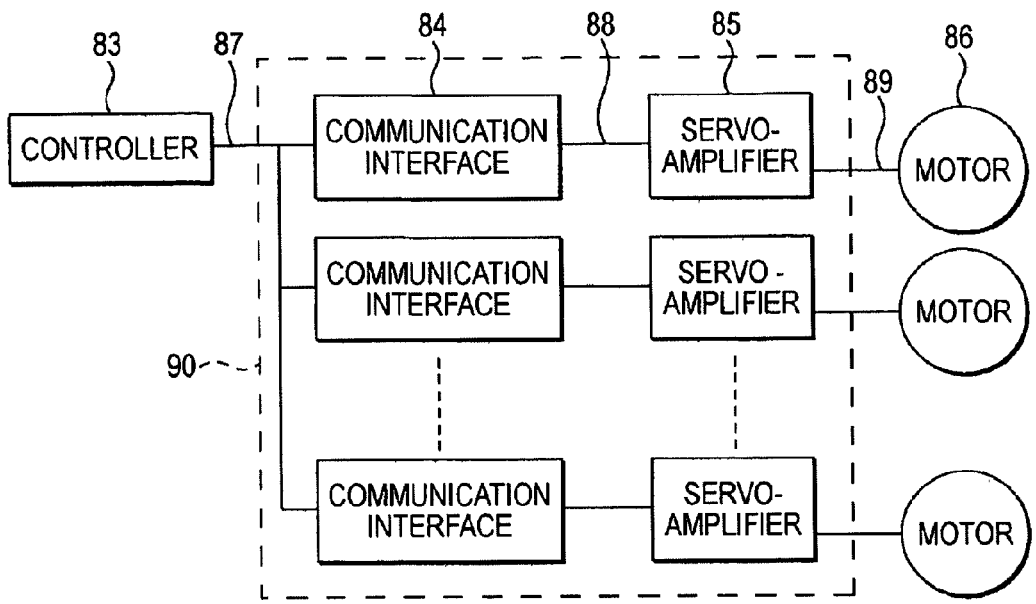
PRIOR ART
FIG. 9 (b)
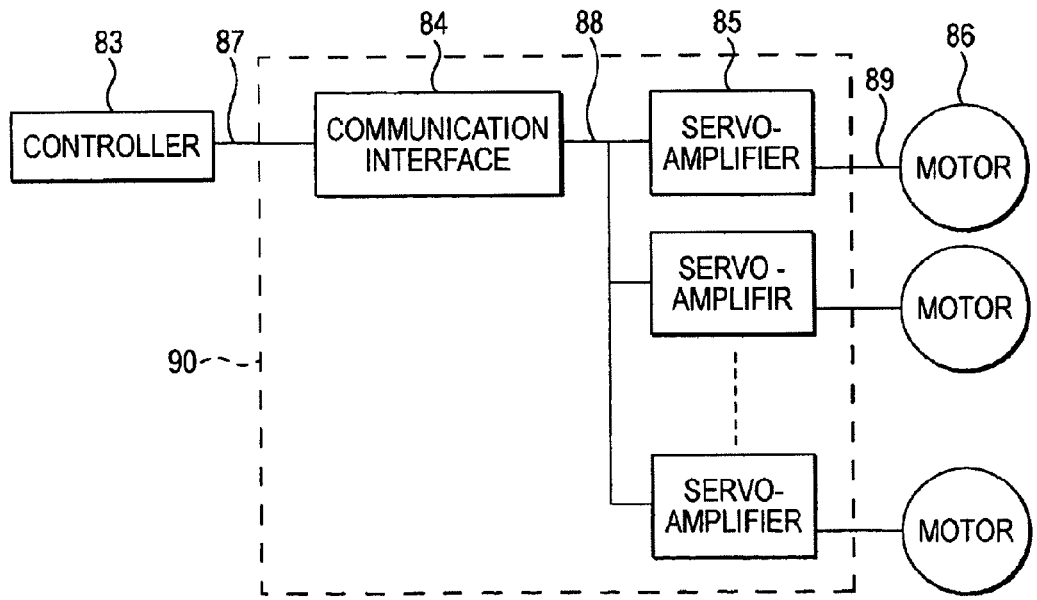

PRIOR ART

METHOD FOR MOUNTING MULTISHAFT SERVO AMPLIFIER MODULE

CROSS-REFERENCE TO RELATED APPLICATION

This application is the U.S. National Phase under 35 U.S.C. 371 of International Application PCT/JP03/13143, filed Oct. 14, 2003, which claims priority to Japanese Patent Application No. 2002-305941, filed Oct. 21, 2002.

BACKGROUND OF THE INVENTION

1. Technical Field

The present invention relates to a method for mounting multishaft servo-amplifier modules on a multishaft servo-amplifier for driving motors used in an industrial machine.

2. Background Art

Conventionally, for simultaneously controlling a plurality of motors by a host controller, the connection between the host controller and a servo-amplifier for driving respective shafts is electrically provided through bus connection, serial communication or the like using a communication interface device which is connected to a transmission cable (see JP-A-2002-140103, for example).

FIG. 9(a) and FIG. 9(b) are block diagrams showing configuration examples of the multishaft servo-amplifier used in the above case. FIG. 9(a) shows Configuration Example 1 and FIG. 9(b) shows Configuration Example 2 of the multishaft servo-amplifier. In FIGS. 9(a) and 9(b), reference number 83 designates a host controller, reference numbers 84 designate communication interfaces, reference numbers 85 designate multishaft servo-amplifier modules, reference number 86 designate servo-motors, reference number 87 designates a transmission cable, reference number 88 designate bus connections or serial communication or the like, reference number 89 designate motor cables, and reference number 90 designate a multishaft servo-amplifier function unit 90.

As illustrated in these figures, for controlling a plurality of servo-amplifiers, the host controller 83 is typically connected to the communication interfaces 84 through the transmission cable 87. The communication interfaces 84 are further connected to the multishaft servo-amplifier modules 85 through the bus connection, the serial communication or the like 88.

FIG. 9(a) shows the example where the communication interfaces 84 and the servo-amplifier modules 85 are arranged with a one-to-one correspondence. FIG. 9(b) shows the example where one communication interface 84 is provided for the plural servo-amplifier modules 85 with a one-to-N (plural) correspondence.

In both of the examples, the plural multishaft servo-amplifier modules are often collectively disposed in a side-by-side arrangement together with the communication interface(s) for reasons of limitation to a supply line or the like of a power source and to wiring or for other reasons.

An area boxed by a dotted line is the multishaft servo-amplifier function unit 90 including plural multishaft servo-amplifier modules disposed side by side. Each of the multishaft servo-amplifier modules 85 is connected to the corresponding servo-motor 86 through the motor cable 89.

A typical mechanical method for providing a side-by-side arrangement of the multishaft servo-amplifier function unit 90 as the multishaft servo-amplifier involves a base-mounted type where the multishaft servo-amplifier modules are mounted on a base plate for installation, a rack-mounted type where the multishaft servo-amplifier modules are mounted on a rack, and the like.

An example of the method for mounting the multishaft servo-amplifier modules is described herein referring to the appended drawing. FIG. 10 is an isometric drawing illustrating an example of an entire structure of a multishaft servo-amplifier on which base-mounted type multishaft servo-amplifier modules are mounted by a conventional method.

The multishaft servo-amplifier shown in the figure includes one communication interface and six multishaft servo-amplifier modules, thereby constituting a six-shaft servo-amplifier which controls six servo-motors by the entire structure.

This multishaft servo-amplifier corresponds to the multishaft servo-amplifier function unit 90 shown in FIG. 9(b), where one communication interface 92 and six multishaft servo-amplifier modules 93 are mounted on a base plate 91.

Each of the multishaft servo-amplifier modules 93 has a case 102, and a printed board 103 which is equipped with semiconductor power elements and electronic parts generally required for a servo-amplifier.

Connectors 96 and 97 disposed on each of the multishaft servo-amplifier modules 93 electrically connects to a motor or an encoder, or electrically supplies power, control signals, signal inputs/outputs, transmission and the like. The connectors 96 and 97 are mounted on the printed board 103.

Connectors 94 and 95 disposed on the communication interface 92 electrically supplies power, control signals, signal inputs/outputs, transmission and the like. The connectors 94 and 95 are connected with the host controller through the transmission cable.

The communication interface 92 and the multishaft servo-amplifier modules 93 are electrically connected to each other through bus connection, serial communication or the like, which is omitted in the figure.

As for mechanical connections relating to the present invention, the printed boards 103 of the six multishaft servo-amplifier modules 93 are mounted on the base plate 91, which has a sufficient area and strength for mounting the plural multishaft servo-amplifier modules 93, in such positions as to be disposed perpendicularly to the flat surface of the base plate 91. Each of the multishaft servo-amplifier modules 93 is fixed to the base plate 91 by screws 101 having a length appropriate for fixation therebetween, which screws are inserted into two multishaft servo-amplifier module fixing plate upper holes and two multishaft servo-amplifier module fixing plate lower holes 100 provided on upper and lower multishaft servo-amplifier module fixing plates 99, respectively, and are inserted into four multishaft servo-amplifier module attachment screw taps 98 provided on the base plate 91 in correspondence with the upper and lower holes 100.

As described above, in the conventional base-mounted type servo-amplifier for a host controller, the plural multishaft servo-amplifier modules are mounted on the base plate perpendicularly thereto. These multishaft servo-modules simultaneously control the corresponding plural servo-motors.

In recent years, there has been an increasing need for space-saving installation of a multishaft servo-amplifier. Furthermore, the number of shafts tends to be increased due to enlarged functions in the field of industrial machinery including semiconductor manufacturing apparatus such as a chip mounter. Additionally, the demand for mounting the multishaft servo-amplifier itself on a movable part of a machine has been increasing for the reason of wiring-saving or other reasons.

Accordingly, it is preferable that the multishaft servo-amplifier used in this field is not only small-sized and lightweight but also has high mechanical rigidity and a thin structure for increasing resistance to vibration and shock and for decreasing inertia generated at the time of high-speed motion in the mechanical structure aspects.

In the conventional method, however, the servo-amplifier modules are mounted on the surface of the base plate perpendicularly thereto. As a result, the depth of the multishaft servo-amplifier in the thickness direction of the base plate is large and it is thus impossible to install the multishaft servo-amplifier in a narrow space having a small depth.

Additionally, when the multishaft servo-amplifier is carried on a movable part of a machine, the entire thickness of the multishaft servo-amplifier is large for the carrying surface of the machine. Since the resistance to vibration and shock and the mechanical rigidity are decreased due to the large thickness of the servo-amplifier, it is difficult to mount the servo-amplifier on the movable part of the machine which is required to move at high speed.

DISCLOSURE OF THE INVENTION

Therefore, the invention is made for solving the above various problems, it is an object of the invention to provide a multishaft servo-amplifier which has a thin structure offering high resistance to vibration and shock, and which can be installed in a narrow space and can be carried on a movable part of a machine, by mounting a plurality of servo-amplifier modules on a surface of a base plate in parallel therewith such that the entire thickness of the servo-amplifier can be reduced, and by efficiently mounting the servo-amplifier on both surfaces of the base plate.

For achieving the above object, an embodiment of the invention according to a first aspect provides a method for mounting a plurality of multishaft servo-amplifier modules on a multishaft servo-amplifier for driving motors, each of which modules has an identical shape and an identical function to each other and carries semiconductor power elements. In this method: a multishaft interface substrate as a base plate on which the plural multishaft servo-amplifier modules are mounted is provided to constitute a multishaft servo-amplifier function unit for a host controller; the multishaft servo-amplifier modules are mounted on the surface of the multishaft interface substrate in parallel therewith; and the multishaft servo-amplifier modules are mounted on both the surfaces of the multishaft interface substrate to efficiently mount the plural multishaft servo-amplifier modules on the multishaft interface substrate.

In a second aspect of the invention, in the method for mounting multishaft servo-amplifier modules of the first aspect: connectors for connecting with the multishaft interface substrate are disposed on diagonally facing areas of the multishaft servo-amplifier module, connectors for connecting with the multishaft servo-amplifier module are disposed on both the front and the rear surfaces of the multishaft interface substrate in a zigzag arrangement, and the connectors for connecting with the multishaft servo-amplifier module are alternately disposed on the front and the rear surfaces of the multishaft interface substrate such that the connectors for connecting with the multishaft servo-amplifier module do not interfere with each other; and the multishaft servo-amplifier modules are mounted on the same positions of both the surfaces of the multishaft interface substrate such that the multishaft interface substrate is sandwiched between each pair of the multishaft servo-amplifier modules, and the multishaft servo-amplifier modules are mounted on the multishaft interface substrate in a side-by-side arrangement so as to efficiently mount the plural multishaft servo-amplifier modules on the multishaft interface substrate.

In a third aspect of the invention, in the method for mounting multishaft servo-amplifier modules of the first aspect: through holes used for fixation are formed on the multishaft servo-amplifier modules to provide serially connected through holes formed by mounting the servo-amplifier modules on the same positions of both the surfaces of the multishaft interface substrate such that the multishaft interface substrate is sandwiched between each pair of the multishaft servo-amplifier modules; and the multishaft servo-amplifier modules are fixed to the multishaft interface substrate such that the multishaft interface substrate is sandwiched between the pairs of the multishaft servo-amplifier modules using the serially connected through holes thus formed.

In a fourth aspect of the invention, in the method for mounting multishaft servo-amplifier modules of any one of the first to the third aspects: attachment flat surfaces and structures having sufficient degrees of flatness and parallelism and strength are provided for the multishaft servo-amplifier modules such that the multishaft servo-amplifier can be directly attached to and carried on a movable part of a machine with a decreased entire thickness of the multishaft servo-amplifier for the carrying surface of the movable part of the machine.

According to the methods of the first to the third aspects as described above, it is possible to mount the multishaft servo-amplifier modules on the flat surface of the base plate in parallel therewith and to efficiently mount the multishaft servo-amplifier modules on both the surfaces of the base plate. Thus, a thin type multishaft servo-amplifier having a smaller height in a thickness direction of the base plate than that of a conventional multishaft servo-amplifier is provided.

Therefore, a multishaft servo-amplifier which can be installed in a narrow space is provided.

Additionally, according to the methods of the first to the fourth aspects, a multishaft servo-amplifier having enhanced resistance to vibration and shock and increased mechanical strength is provided since the thin type multishaft servo-amplifier can be carried on a carrying surface of a machine with a decreased entire thickness of the multishaft servo-amplifier for the carrying surface of the machine. Thus, a multishaft servo-amplifier which can be carried on a movable part of a machine required to move at high speed.

BRIEF DESCRIPTION OF THE DRAWINGS

FIG. 2(a) is a front view, FIG. 2(b) is a bottom view, FIG. 2(c) is a right side view and FIG. 2(d) is a back view of the multishaft servo-amplifier module.

FIGS. 3(a) and 3(b) illustrates a multishaft interface substrate of the invention, where FIG. 3(a) is a front view (hidden lines indicated) and FIG. 3(b) is a bottom view of the multishaft interface substrate.

FIGS. 5(a) and 5(b) illustrates the multishaft servo-amplifier modules shown in FIGS. 2(a) to 2(d) and mounted on the multishaft interface substrate shown in FIGS. 3(a) and 3(b), where FIG. 5(a) is a front view (hidden lines indicated) and FIG. 5(b) is a bottom view of the modules and substrate.

FIGS. 9(a) and 9(b) are block diagrams showing examples of a multishaft servo-amplifier, where FIG. 9(a) shows Configuration Example 1 and FIG. 9(b) shows Configuration Example 2.

BEST MODE FOR CARRYING OUT THE INVENTION

An embodiment of the present invention is herein described with reference to the appended drawings.

Figure 1:
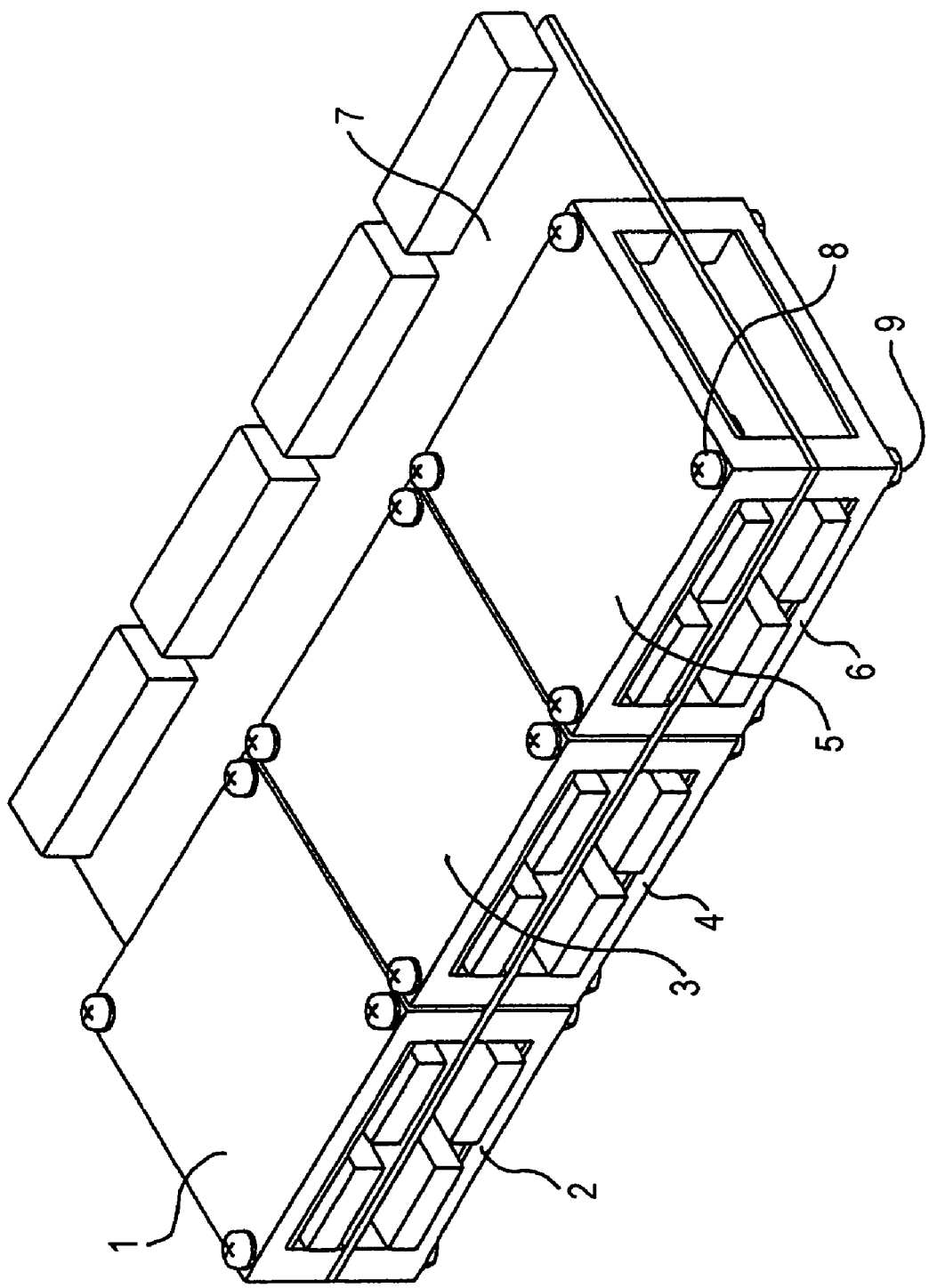
FIG. 1 is an isometric view illustrating an example of an entire structure of a multishaft servo-amplifier on which multishaft servo-amplifier modules are mounted by a method according to the present invention.

FIG. 1 is an isometric drawing illustrating an example of an entire structure of a multishaft servo-amplifier on which multishaft servo-amplifier modules are mounted by a method according to the present invention.

In the figure, a multishaft servo-amplifier module unit (first shaft) 1 for driving a motor is shown, which is a module of a servo-amplifier function unit for driving a motor and is equipped with semiconductor power elements.

Second shaft through sixth shaft multishaft servo-amplifier module units 2 through 6 each having a similar structure are also shown. Each of the second through sixth shaft module units 2 through 6 has a similar shape and a similar function without any differences, but is distinguished from each other by giving each module unit a reference numeral corresponding to the shaft of the motor to be driven by the module unit. In this embodiment, these multishaft servo-amplifier modules 1 through 6 are each mounted on a multishaft interface substrate 7 as a base plate by screws 8 and nuts 9 to constitute a six-shaft servo-amplifier in all. This is a servo-amplifier capable of controlling multiple shafts by connecting a plurality of multishaft servo-amplifier modules to a host controller. By using the multishaft servo modules, a plurality of servomotors corresponding to the modules are simultaneously controlled.

Next, the details of the invention are described in the order of the figure numbers.

Figure 2A:
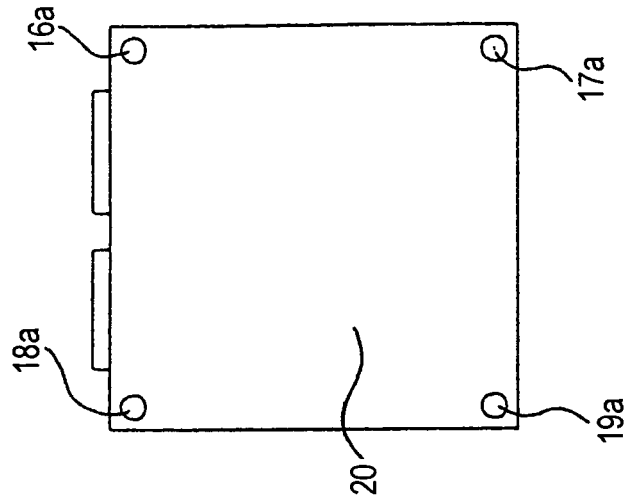
FIGS. 2(a) to 2(d) illustrate the multishaft servo-amplifier module of the invention, where
Figure 2C:
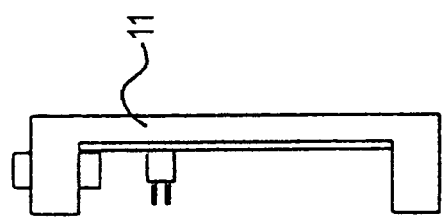
Figure 2D:
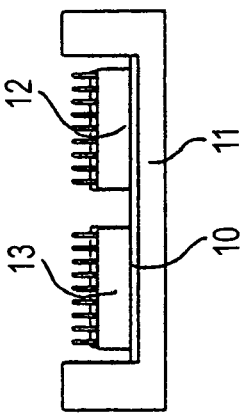
Figure 2B:
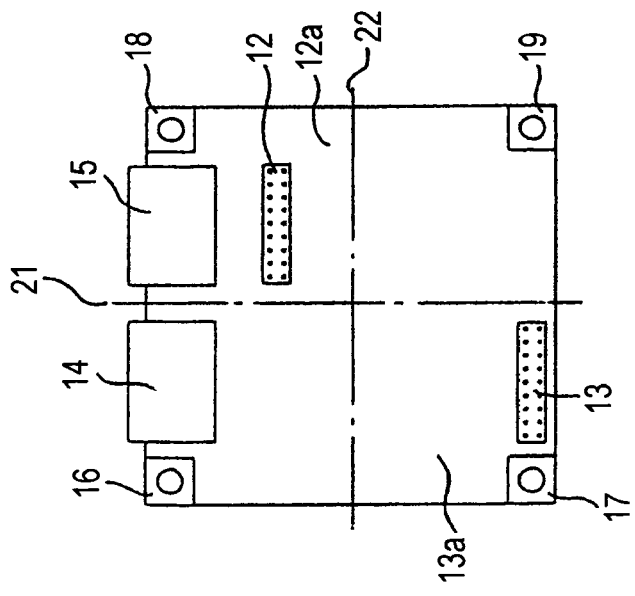

FIGS. 2(a) to 2(d) illustrates the multishaft servo-amplifier module unit for driving a motor, which carries semiconductor power elements. FIG. 2(a) is a front view, FIG. 2(b) is a bottom view, FIG. 2(c) is a right side view, and FIG. 2(d) is a back view of the multishaft servo-amplifier module unit.

The multishaft servo-amplifier module chiefly includes a printed board 10 and a pedestal 11. Connectors 12 and 13 for electrically supplying power and control signals to the multishaft interface substrate are mounted on the printed board 10. These connectors 12 and 13 are disposed in areas 12a and 13a, respectively, which are diagonally positioned on the printed board 10 partitioned by a center line (vertical line) 21 and a center line (horizontal line) 22 in the front view of the multishaft servo-amplifier module shown in FIG. 2(a). That is, the connector 12 and the connector 13 are located in the areas diagonally facing to each other in the front view of the multishaft servo-amplifier module.

Moreover, connectors 14 and 15 for supplying power and control signals to a motor for driving a machine or an encoder, and electronic parts generally required for the servo-amplifier as well as the semiconductor power elements are carried on the printed board 10.

The pedestal 11 is constituted by four pedestal legs 16 through 19 and an attachment flat surface 20 also functioning as an attachment surface to a machine. The pedestal 11 is preferably made from a material which has large mechanical strength and is light-weight considering that the pedestal 11 is carried on a movable part of a machine. In this embodiment, the pedestal 11 is made from integrally formed aluminum material.

The pedestal legs 16 through 19 have through holes 16a through 19a, respectively, which are provided to position and fix the multishaft servo-amplifier module, in the vertical direction in the front view of the multishaft servo-amplifier module.

The printed board 10 and the pedestal 11 are in correspondence with and rigidly fixed to each other. For example, a plurality of holes for screws are formed on the printed board 10, and female screw taps for those screws in the same number as that of the holes of the printed board 10 are formed on the pedestal 11. This structure allows the printed board 10 to be rigidly fixed to the pedestal 11.

FIGS. 3(a) and 3(b) illustrates a multishaft interface substrate unit also functioning as the base plate on which the plural servo-amplifier modules are mounted to constitute the multishaft servo-amplifier function unit for the host controller. FIG. 3(a) is a front view (hidden lines indicated) and FIG. 3(b) is a bottom view of the multishaft interface substrate unit.

In this embodiment, the multishaft interface substrate 7 is a base plate substrate on which six multishaft servo-amplifier modules are mounted to constitute a servo-amplifier capable of driving six motors.

The multishaft interface substrate 7 has connectors for electrically supplying power and control signals to the servo-amplifier modules. The connectors are disposed on both surfaces of the substrate 7 in a zigzag arrangement, and are alternately positioned on each side of the substrate 7.

More specifically, connectors 23 and 24 are connectors which electrically connects to the multishaft servo-amplifier module 1 (first shaft) and are carried on the front surface of the multishaft interface substrate 7. Connectors 23a and 24a are connectors which electrically connects to the multishaft servo-amplifier module 2 (second shaft) and are carried on the rear surface of the multishaft interface substrate 7.

Similarly, connectors 25 and 26 are connectors which electrically connect to the multishaft servo-amplifier module 3 (third shaft) and are carried on the front surface of the multishaft interface substrate 7. Connectors 25a and 26a are connectors which electrically connect to the multishaft servo-amplifier module 4 (fourth shaft) and are carried on the rear surface of the multishaft interface substrate 7.

Similarly, connectors 27 and 28 are connectors which electrically connect to the multishaft servo-amplifier module 5 (fifth shaft) and are carried on the front surface of the multishaft interface substrate 7. Connectors 27a and 28a are connectors which electrically connect to the multishaft servo-amplifier module 6 (sixth shaft) and are carried on the rear surface of the multishaft interface substrate 7.

Thus, the connectors 23 through 28 and the connectors 23a through 28a are disposed on the front surface and the rear surface, respectively, of the multishaft interface substrate 7 in a zigzag arrangement and are alternately positioned such that each of the connectors on the front and the rear surfaces does not interfere with the connector on the opposite side.

The connectors 23 and 24 are arranged in correspondence with the connectors 12 and 13 provided on the multishaft servo-amplifier module 1 (first shaft) for connection with the multishaft interface substrate with the same pitch as that of the connectors 12 and 13. Similarly, the connectors 25 and 26, 27 and 28, 23a and 24a, 25a and 26a, and 27a and 28a are positioned with the same pitch.

Furthermore, the multishaft interface substrate 7 carries a communication interface function unit for providing transmission for the host controller, connectors 29 through 32 for supplying power to the amplifier, and connectors for electrically supplying control signals, signal inputs and outputs, transmission and the like from the host controller.

The multishaft interface substrate 7 also carries ectronic parts required for constituting the entire multishaft servo-amplifier on which the multishaft servo-amplifier modules are mounted, but such electric parts are omitted in the figure.

Holes 33 through 36 for positioning and fixing the multishaft servo-amplifier modules are shown in the figure. In this embodiment, the holes 33 through 36 correspond to both the multishaft servo-amplifier module 1 (first shaft) and the multishaft servo-amplifier module 2 (second shaft), and simultaneously fix these two multishaft servo-amplifier modules.

Similarly, holes 37 through 40 are provided for positioning and fixing both the multishaft servo-amplifier module 3 (third shaft) and the multishaft servo-amplifier module 4 (fourth shaft), and holes 41 through 44 are provided for positioning and fixing both the multishaft servo-amplifier module 5 (fifth shaft) and the multishaft servo-amplifier module 6 (sixth shaft).

Figure 4:
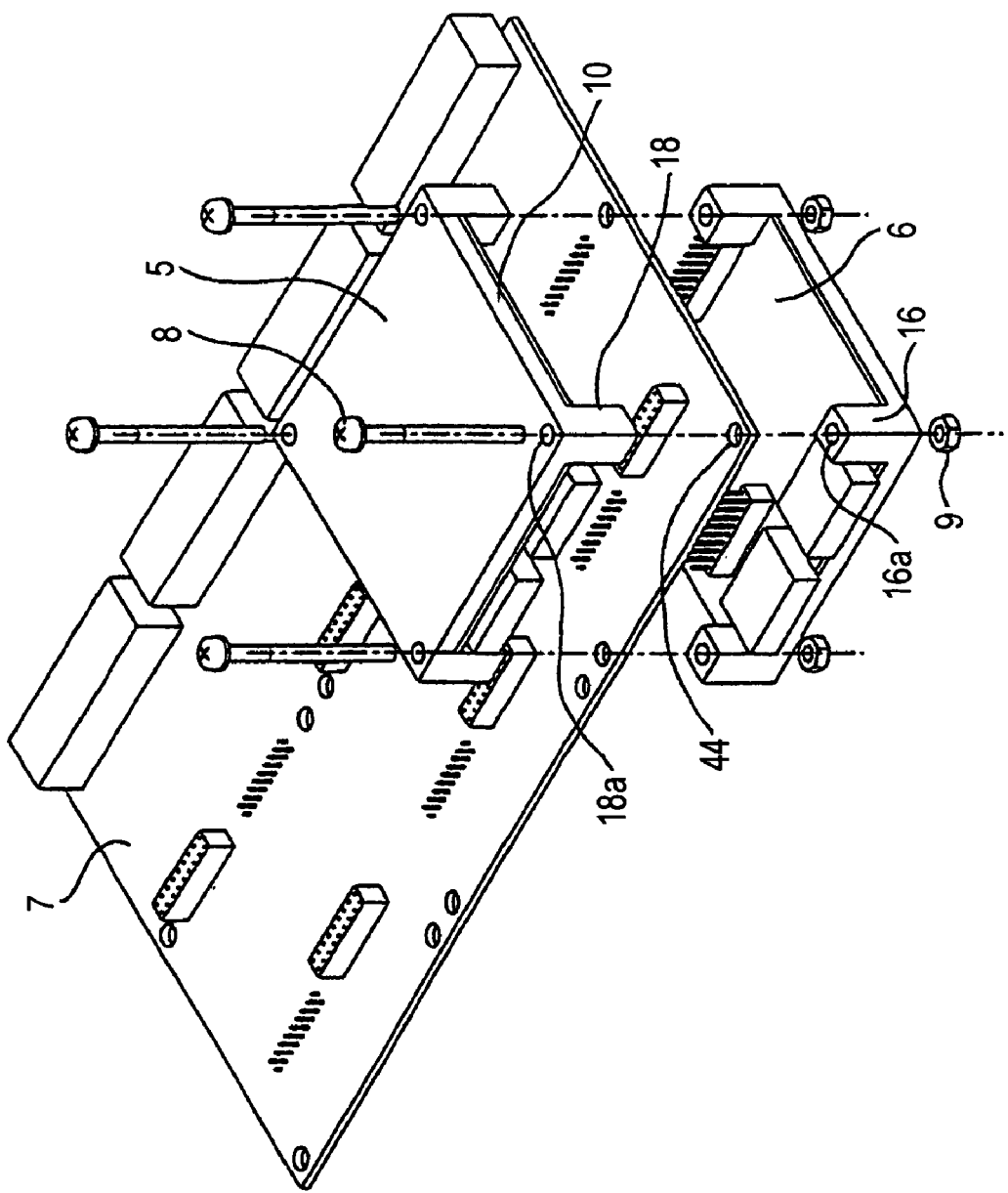
FIG. 4 is an exploded view of the multishaft servo-amplifier modules shown in FIGS. 2(a) to 2(d) and the multishaft interface substrate shown in FIGS. 3(a) and 3(b).

FIG. 4 is an exploded view of the multishaft servo-amplifier modules shown in FIGS. 2(a) to 2(d) and the multishaft interface substrate shown in FIGS. 3(a) and 3(b). In this figure, only the multishaft servo-amplifier module 5 (fifth shaft) and the multishaft servo-amplifier module 6 (sixth shaft) are illustrated as a disassembly example.

FIGS. 5(a) and 5(b) illustrate the six multishaft servo-amplifier modules shown in FIGS. 2(a) to 2(d) which are mounted on the multishaft interface substrate shown in FIGS. 3(a) and 3(b). FIG. 5(a) is a front view (hidden lines indicated) and FIG. 5(b) is a bottom view of the servo-amplifier modules.

Next, a method for mounting the two multishaft servo-amplifier modules 5 (fifth shaft) and 6 (sixth shaft) on the multishaft interface substrate 7 also functioning as the base plate is sequentially described.

The connectors 12 and 13 (both shown in FIGS. 2(a) to 2(d)) carried on the multishaft servo-amplifier module 5 (fifth shaft) for connection with the multishaft interface substrate are brought into engagement with the connectors 27 and 28 (both shown in FIGS. 3(a) and 3(b)), respectively, carried on the front surface of the multishaft interface substrate 7 for connection with the multishaft servo-amplifier module.

Connector engagement positions 49 and 50 are shown in FIG. 5(a). Similarly, the connectors 12 and 13 carried on the multishaft servo-amplifier module 6 (sixth shaft), which connectors have a shape and a function identical to those on the multishaft servo-amplifier module 5, for connection with the multishaft interface substrate are brought into engagement with the connectors 27a and 28a, respectively, carried on the rear surface of the multishaft interface substrate 7 for connection with the multishaft servo-amplifier module.

Connector engagement positions 49a and 50a are shown in FIG. 5(a). In this arrangement, the connectors 12 and 13 for the connection with the multishaft interface substrate are disposed on diagonally facing areas of the multishaft servo-amplifier module, and simultaneously the connectors for connection with the multishaft servo-amplifier module are disposed on both the front and the rear surfaces of the multishaft interface substrate 7 in a zigzag arrangement and are alternately positioned such that the connectors provided on the front and rear surfaces of the multishaft interface substrate 7 for connection with the multishaft servo-amplifier module do not interfere with each other. Thus, for mounting the multishaft servo-amplifier modules on the multishaft interface substrate 7, the substrate 7 is sandwiched between the pairs of the multishaft servo-amplifier modules which are located at the same positions of the opposite surfaces. In this structure, the printed board 10 of each servo-amplifier module is mounted on the flat surface of the multishaft interface substrate 7 in parallel therewith.

Described next is a method for fixing these two multishaft servo-amplifier modules which have been mounted on both the surfaces of the multishaft interface substrate in parallel therewith under the above-described condition.

As illustrated in FIG. 4, the though hole 16a for positioning and fixing the multishaft servo-amplifier module 5 (fifth shaft) is formed in the pedestal 16 which is disposed at one of the four corners of the multishaft servo-amplifier module 5 (fifth shaft). Similarly, the through hole 18a for positioning and fixing the multishaft servo-amplifier module 6 (sixth shaft) is formed in the pedestal 18 of the multishaft servo-amplifier module 6 (sixth shaft). Also, the hole 44 for positioning and fixing the multishaft servo-amplifier modules is provided on the multishaft interface substrate 7.

When the multishaft servo-amplifier 5 (fifth shaft) and the multishaft servo-amplifier 6 (sixth shaft) are mounted on the multishaft interface substrate 7, the through holes 18a, the hole 44 and the through hole 16a are connected. That is, a serially connected through hole is formed by mounting the pair of the multishaft servo-amplifier modules such that the multishaft interface substrate is sandwiched by the modules. By using the screw 8 having a sufficient length to be inserted into the through hole thus formed and the nut 9 fitting with the screw 8, the two multishaft servo-amplifier modules can be fixed to the multishaft interface substrate such that the interface substrate is sandwiched between the two servo-amplifier modules. The remaining three positions of the four corners are fixed by inserting the screws into serially connected through holes thus formed and by attaching the nuts in the same manner.

The method for mounting the multishaft servo-amplifier module 5 (fifth shaft) and the multishaft servo-amplifier module 6 (sixth shaft) on the multishaft interface substrate and for fixing those servo-amplifier modules 5 and 6 to the interface substrate such that the interface substrate is sandwiched between the servo-amplifier modules 5 and 6 as described above is applied to the pair of the multishaft servo-amplifier module 1 (first shaft) and the multishaft servo-amplifier module 2 (second shaft) and to the pair of the multishaft servo-amplifier module 3 (third shaft) and the multishaft servo-amplifier module 4 (fourth shaft). The six servo-amplifier modules in all are thus mounted on the multishaft interface substrate in a side-by-side arrangement, thereby constituting a six-shaft servo-amplifier.

By mounting the multishaft servo-amplifier modules on the flat surface of the base plate in parallel therewith, a thin type multishaft servo-amplifier having a smaller height in the thickness direction of the base plate than the conventional multishaft servo-amplifier can be provided.

When the multishaft servo-amplifier modules are mounted on the flat surface of the base plate in parallel therewith, the mounting efficiency will be deteriorated since such a structure requires a large area for mounting the servo-amplifier modules. However, for overcoming this drawback, the servo-amplifier modules are mounted on both the surfaces of the base plate in this embodiment, which allows the mounting area to be increased and the mounting efficiency to be enhanced.

Next, a method for attaching the multishaft servo-amplifier to an industrial machine is described referring to a chip mounter for automatically mounting electronic parts and the like on the printed board as an example.

Figure 6:
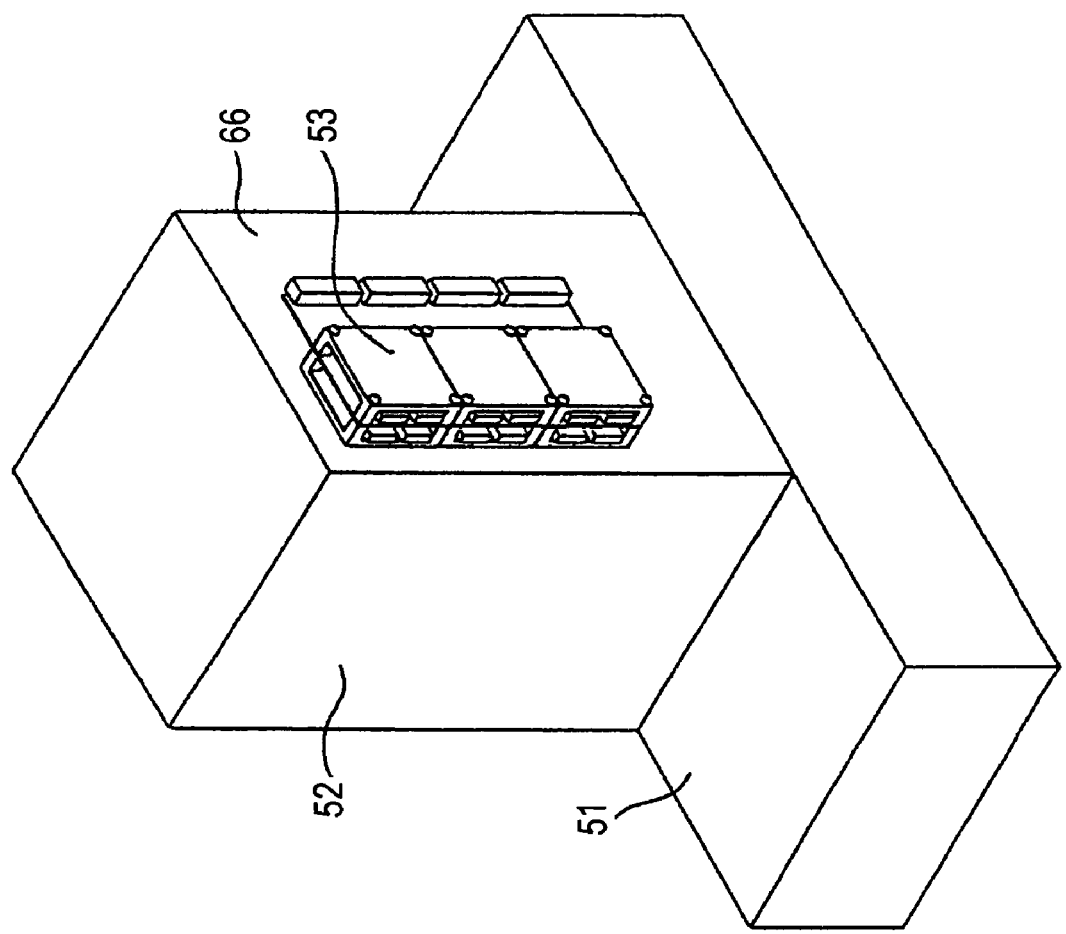
FIG. 6 is an isometric view of the multishaft servo-amplifier carried on a movable part of an industrial machine.

FIG. 6 is an isometric view of the multishaft servo-amplifier carried on a movable part of a chip mounter. The chip mounter includes a mounter table 51 and a mounter head 52. The mounter head 52 moves the mounter table 51 in a horizontal direction or a vertical direction. An attachment flat surface 66 of the mounter head 52 is made from metal such as aluminum which has sufficient mechanical strength and degrees of flatness and parallelism for directly carrying a multishaft servo-amplifier 53.

Figure 7:
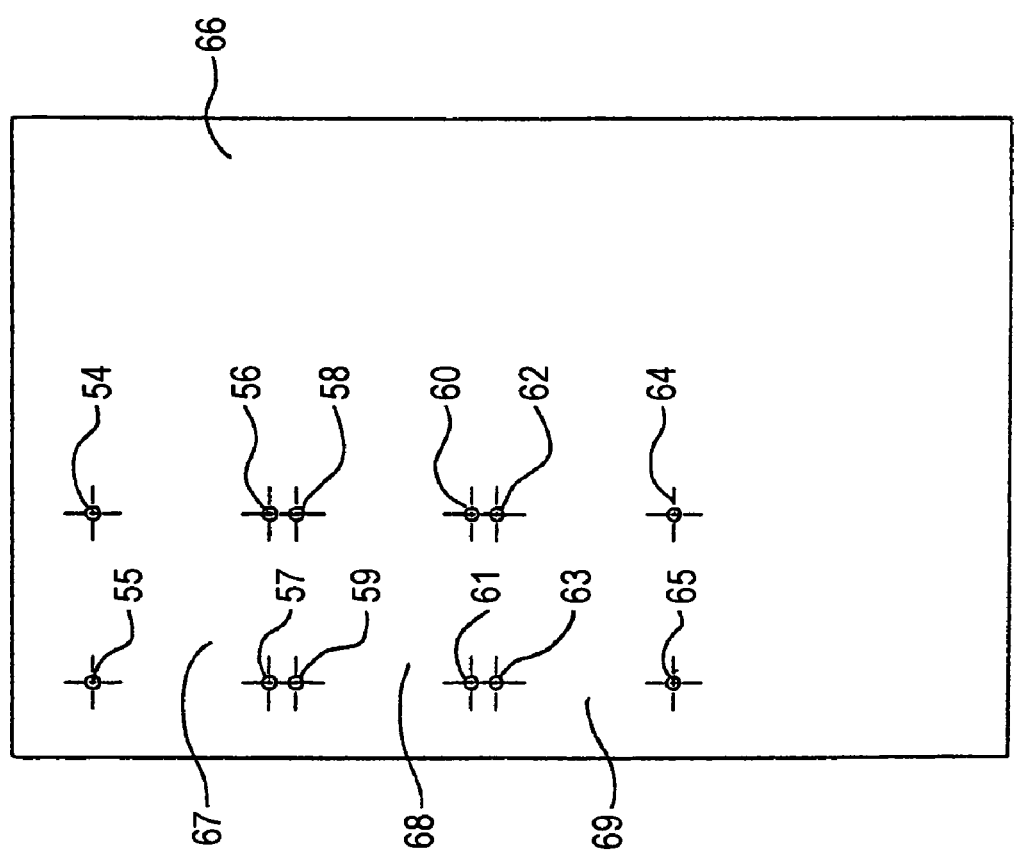
FIG. 7 shows attachment positions of the movable part of the industrial machine to which the multishaft servo-amplifier is attached.

As illustrated in FIG. 7, screw taps used for mounting the multishaft servo-amplifier are prepared on the attachment flat surface 66 of the mounter head.

A flat surface region 67 encompassed by four screw taps 54 through 57 used for attaching the multishaft servo-amplifier corresponds to a flat surface to which the multishaft servo-amplifier module 2 (second shaft) is attached.

Similarly, a flat surface region 68 encompassed by four screw taps 58 through 61 used for attaching the multishaft servo-amplifier corresponds to a flat surface to which the multishaft servo-amplifier module 4 (fourth shaft) is attached.

Similarly, a flat surface region 69 encompassed by four screw taps 62 through 65 used for attaching the multishaft servo-amplifier corresponds to a flat surface to which the multishaft servo-amplifier module 6 (sixth shaft) is attached.

The attachment flat surfaces 66 through 68 have sufficient mechanical strength, degrees of flatness and parallelism, and a hole depth for directly carrying the multishaft servo-amplifier 53.

Figure 8:
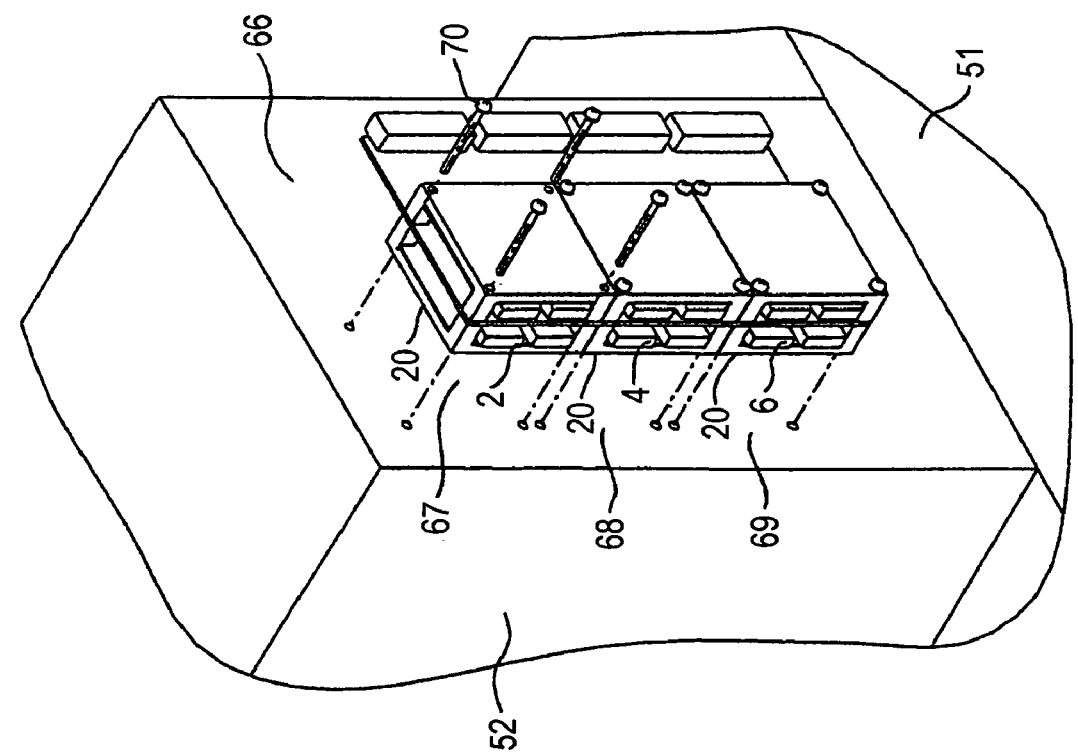
FIG. 8 illustrates attachment of the multishaft servo-amplifier to the movable part of the industrial machine in detail.
Figure 10:
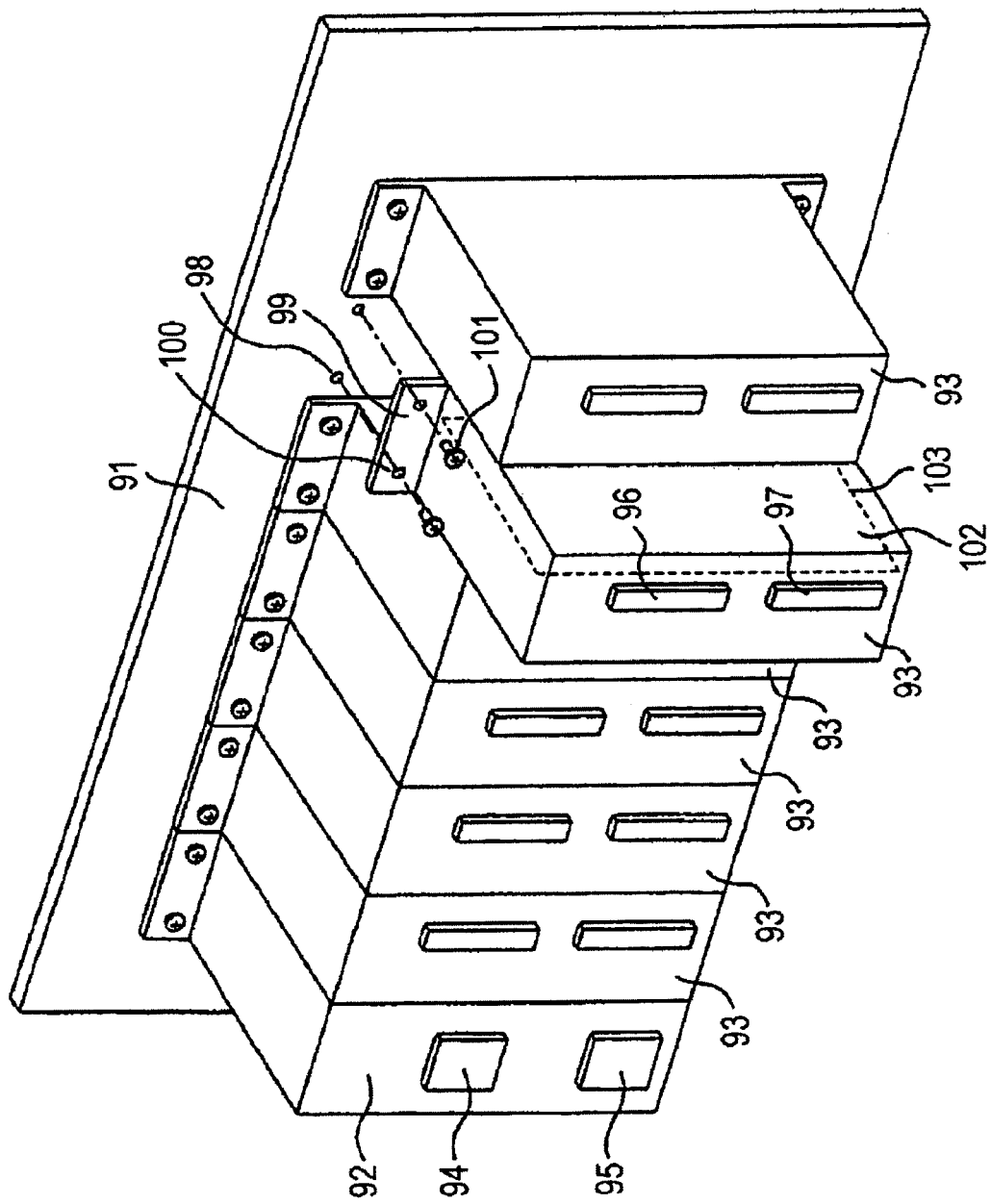
FIG. 10 is an isometric view illustrating an example of an entire structure of a multishaft servo-amplifier on which base-mounted type multishaft servo-amplifier modules are mounted by a conventional method.

FIG. 8 illustrates attachment of the multishaft servo-amplifier to the mounter head 52 (a movable part of a machine). Each of the multishaft servo-amplifier module 2 (second shaft), the multishaft servo-amplifier module 4 (fourth shaft), and the multishaft servo-amplifier module 6 (sixth shaft) has the pedestal attachment flat surface 20 for attachment to a machine at the pedestal of the multishaft servo-amplifier module (see FIGS. 2(a) to 2(d)). The flat surface 20 also has sufficient mechanical strength and degrees of flatness and parallelism for attachment to the movable part of the machine.

The pedestal attachment flat surface 20 of the second multishaft servo-amplifier module 2 (second shaft) for attachment to a machine is brought into surface contact with the flat surface 67 of the chip mounter for attachment to the multishaft servo-amplifier module, such that hole positions 71 through 74 for fixing the multishaft servo-amplifier module 1 (first shaft) and the multishaft servo-amplifier module 2 (second shaft) to the multishaft interface substrate 7 shown in FIGS. 5(a) and 5(b) are aligned with the screw taps 54 through 57 for attaching the mutishaft servo-amplifier shown in FIG. 7.

Under this condition, as shown in FIG. 8, by inserting screws 70 for fixing the multishaft servo-amplifier into the holes provided in the pedestal legs of the multishaft servo-amplifier modules, the multishaft servo-amplifier modules attached to the multishaft interface substrate can be screw-fixed at four positions of the screw taps 54 through 57 provided on the chip mounter for attaching the multishaft servo-amplifier.

Similarly, the pedestal attachment flat surface 20 of the multishaft servo-amplifier module 4 (fourth shaft) for attachment to a machine is positioned with respect to the screw taps 58 through 61 for attaching the multishaft servo-amplifier in surface contact between the pedestal attachment flat surface 20 and the flat surface 68 of the chip mounter for attachment to the multishaft servo-amplifier module. Also, the pedestal attachment flat surface 20 of the multishaft servo-amplifier module 6 (sixth shaft) for attachment to a machine is positioned with respect to the screw taps 62 through 65 for attaching the multishaft servo-amplifier in surface contact between the pedestal attachment flat surface 20 and the flat surface 69 of the chip mounter for attachment to the multishaft servo-amplifier module.

The multishaft servo-amplifier modules 4 (fourth shaft) and the multishaft servo-amplifier modules 6 (sixth shaft) are further screw-fixed to the screw taps 58 through 61 and 62 through 65 provided on the chip mounter for attaching the multishaft servo-amplifier, respectively, by the screws 70 for fixing the multishaft servo-amplifier.

Since the servo-amplifier modules themselves are provided with the attachment flat surfaces and the structure having sufficient degrees of flatness and parallelism as described above, the thin-type multishaft servo-amplifier can be directly attached onto a movable part of a machine including semiconductor manufacturing apparatus such as a chip mounter.

As described above, the thin type multishaft servo-amplifier can be attached such that its entire thickness for a carrying surface of a machine is decreased. With the decreased entire thickness of the servo-amplifier for a carrying surface of a machine, resistance to vibration and shock and mechanical rigidity of the amplifier are increased due to the small thickness and thus the amplifier can be carried on a movable part of a machine required to move at high speed.

While the six-shaft servo-amplifier is shown in this embodiment, the multishaft interface substrate for six shafts may mount one up to six multishaft servo-amplifier modules as a modified embodiment. In the above description, the multishaft servo-amplifier modules are mounted at the same positions of both the surfaces of the multishaft interface substrate such that the interface substrate is sandwiched between the pairs of the servo-amplifier modules for fixing the servo-amplifier modules to the substrate. However, such a structure may be adopted in which the multishaft servo-amplifier modules are mounted on either the front or the rear surface of the multishaft interface substrate and the multishaft servo-amplifier modules are fixed to the multishaft interface substrate using screws having sufficient length for fixing the modules to the substrate and nuts fitting with the screws. That is, it is possible to freely select the shaft number of the multishaft servo-amplifier modules from one to six as long as it is within the maximum shaft number.

In another modified embodiment, the shaft number can be more freely selected by employing a multishaft interface substrate capable of mounting 8-shaft, 10-shaft, 12-shaft or larger shaft number multishaft servo-amplifier modules. That is, a multishaft servo-amplifier for any number of shafts which is applicable to various purposes of use with flexibility can be provided by preparing multishaft interface substrates for a single up to plural shafts.

In still another modified embodiment, the arrangement of the multishaft servo-amplifier modules is not limited to a linear and side-by-side arrangement as in this embodiment. In the embodiment described herein, the pair of the multishaft servo-amplifier module 1 (first shaft) and the multishaft servo-amplifier module 2 (second shaft), the pair of the multishaft servo-amplifier module 3 (third shaft) and the multishaft servo-amplifier module 4 (fourth shaft), and the pair of the multishaft servo-amplifier module 5 (fifth shaft) and the multishaft servo-amplifier module 6 (sixth shaft) are linearly disposed adjacent to each other as shown in FIG. 5(a). It is possible, however, to mount the multishaft servo-amplifier modules on any positions of the multishaft interface substrate other than in the linear arrangement as long as the pair of the multishaft servo-amplifier modules are mounted such that one module is on the same position of one surface of the multishaft interface substrate and the other module is on the same position of the other surface of the interface substrate and as long as the interface substrate is sandwiched between the pair of the modules for fixing the modules thereto. Thus, a multishaft servo-amplifier which is applicable to any shapes in accordance with purposes of use with flexibility can be provided.

INDUSTRIAL APPLICABILITY

The present invention is applicable to a method for mounting multishaft servo-amplifier modules on a multishaft servo-amplifier for driving motors used especially for an industrial machine so as to provide a thin amplifier structure having high resistance to vibration and shock. The invention is thus utilized in a field of manufacturing and providing the multishaft servo-amplifier which can be installed in a narrow space and can be carried on a movable part of a machine.

The invention claimed is:

1. A method for mounting a plurality of servo-amplifier modules for driving motors on a multishaft servo-amplifier, each of the plurality of servo-amplifier modules includes an identical shape and an identical function to each other and has semiconductor power elements, comprising:

preparing a multishaft interface substrate, that constitutes a multishaft servo-amplifier function unit for a host controller, as a base plate on which the plurality of multishaft servo-amplifier modules are mounted;

mounting the multishaft servo-amplifier modules on surfaces of the multishaft interface substrate in parallel therewith;

mounting the multishaft servo-amplifier modules on the both surfaces of the multishaft interface substrate to efficiently mount the plural multishaft servo-amplifier modules on the multishaft interface substrate;

disposing connectors for connecting with the multishaft interface substrate on diagonally facing areas of the multishaft servo-amplifier module, disposing connectors for connecting with the multishaft servo-amplifier module on the both front and rear surfaces of the multishaft interface substrate in a zigzag arrangement, and disposing the plurality of the multishaft servo-amplifier modules alternately on the front and the rear surfaces of the multishaft interface substrate such that the connectors for connecting with the multishaft servo-amplifier module do not interfere with each other; and mounting the multishaft servo-amplifier modules on the same positions of the both surfaces of the multishaft interface substrate such that the multishaft interface substrate is sandwiched between each pair of the multishaft servo-amplifier modules, and mounting the multishaft servo-amplifier modules on the multishaft interface substrate in a side-by-side arrangement so as to efficiently mount the plural multishaft servo-amplifier modules on the multishaft interface substrate.

2. A method for mounting a plurality of servo-amplifier modules for driving motors on a multishaft servo-amplifier, each of the plurality of servo-amplifier modules includes an identical shape and an identical function to each other and has semiconductor power elements, comprising:

preparing a multishaft interface substrate, that constitutes a multishaft servo-amplifier function unit for a host controller, as a base plate on which the plurality of multishaft servo-amplifier modules are mounted;

mounting the multishaft servo-amplifier modules on surfaces of the multishaft interface substrate in parallel therewith;

mounting the multishaft servo-amplifier modules on the both surfaces of the multishaft interface substrate to efficiently mount the plural multishaft servo-amplifier modules on the multishaft interface substrate;

forming through holes used for fixation on the multishaft servo-amplifier modules to provide serially connected through holes formed by mounting the servo-amplifier modules on the same positions of the both surfaces of the multishaft interface substrate such that the multishaft interface substrate is sandwiched between each pair of the multishaft servo-amplifier modules; and fixing the multishaft servo-amplifier modules to the multishaft interface substrate such that the multishaft interface substrate is sandwiched between the pairs of the multishaft servo-amplifier modules using the serially connected through holes thus formed.

3. The method for mounting a plurality multishaft servo-amplifier modules according to any one of claims 1 to 2, further comprising:

providing attachment flat surfaces and structures having sufficient degrees of flatness and parallelism and strength for the multishaft servo-amplifier modules such that the multishaft servo-amplifier can be directly attached to and carried on a movable part of a machine with a decreased entire thickness of the multishaft servo-amplifier for the carrying surface of the movable part of the machine.

\* \* \* \* \*